March 11, 1958 J. J. SURAN 2,826,696

DOUBLE-BASE DIODE D. C.-A. C. (F.-M. ) CONVERTER

Filed Aug. 30, 1956

INVENTOR:
JEROME J. SURAN,

BY Robert J. Steinmeyer

HIS ATTORNEY.

United States Patent Office 2,826,696
Patented Mar. 11, 1958

2,826,696

DOUBLE-BASE DIODE D. C.-A. C. (F.-M.) CONVERTER

Jerome J. Suran, Syracuse, N. Y., assignor to General Electric Company, a corporation of New York Application August 30, 1956, Serial No. 607,214

3 Claims. (Cl. 250—36)

Figure 1:
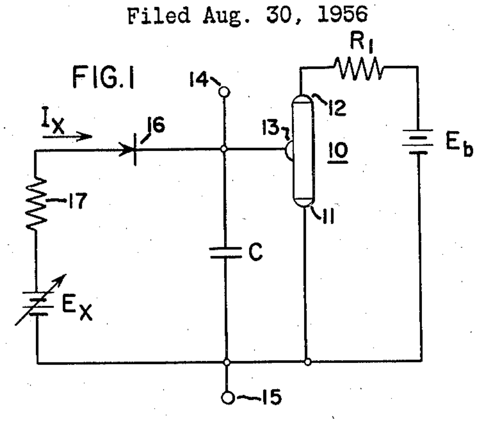

This invention relates to direct current to alternating current frequency modulated converters and has as a particular object thereof to provide a converter employing a single junction semiconductor device. A semiconductor device having suitable characteristics and exhibiting particular advantages in this converter is the "double-base diode."

The "double-base diode" has heretofore been described by Lesk, U. S. Patent 2,769,926 and Engel, U. S. patent application, Serial No. 373,828, filed August 12, 1953, both of which are assigned to the assignee of the present invention. The double-base diode is a three terminal semiconducting device having a single rectifying junction disposed intermediately between spaced ohmic electrodes. The physical characteristics of this device and its basic mode of operation are described in the above referenced patent and application. The ohmic electrodes of the double-base diode serve respectively as output and common electrodes while the rectifying junction serves as an input electrode. The double-base diode exhibits an input characteristic having three dissimilar regions. The first region, termed the cut-off region, is characterized by a steeply rising junction voltage versus junction current curve attributable to the fact that the input junction is poled to oppose input current flow. As the input voltage increases to a given peak value, determined by the device geometry and the interbase potential, the junction bias is reversed, and a negative resistance region occurs. The initial downward slope of the negative resistance region may be quite steep, but the slope decreases to zero at a "valley point," after which it becomes positive. The region beyond the valley point is termed the saturating region, and is characterized by a low positive resistance. In both the negative resistance region and in the initial portion of the saturating region, the double-base diode exhibits active properties, having current gain. Further information describing the basic double-base diode oscillator, around which the present invention is built, may be derived from an inspection of U. S. Patent 2,792,499, entitled "Sawtooth Wave Generator," filed on behalf of V. P. Mathis and also assigned to the assignee of the instant invention.

While D. C. to A. C. frequency modulated converters are old, such converters have heretofore employed vacuum tubes or multiple junction semiconductors. One prior art circuit employs a thyratron having a capacitor coupled across its cathode and grid, the charging rate of which may be varied an any conventional manner. A bias is applied across the plate and cathode. When the voltage of the capacitor reaches the level at which the thyratron fires the capacitor discharges to a level low enough to cut off the thyratron and a sawtooth output can be taken from across the capacitor. The network of my invention eliminates the need for a tube and hence improves circuit reliability while obviating the need for LC type feedback used in corresponding multiple junction semiconductor circuitry.

Accordingly, it is a primary object of this invention to provide new and novel converter networks of relatively simple structure.

It is another object of my invention to provide a new and novel converter employing a single junction semiconductor.

A further object of my invention is to provide such a converter which will exhibit component ruggedness.

These and other objects of my invention are achieved in a novel converter wherein a semiconductor body is provided with spaced predominantly bilaterally conducting electrodes and a predominantly unilaterally conducting junction electrode disposed therebetween. The body can exhibit a negative resistance between the junction and one of the bilaterally conducting electrodes and has a potential storage means connected across the junction electrode and one of the bilaterally conducting electrodes. A potential source is connected across the bilaterally conducting electrodes. A variable potential source of sufficient magnitude to charge the storage means to a given level, at which it will discharge due to junction breakdown in the semiconductor, is connected across the storage means in order to regulate its charging rate. This process of charge of the storage means and discharge thereof through the junction will repeat itself, and a regulated alternating output may be taken from across the storage means or across an impedance element in series with the energy source connected between the bilaterally conducting electrodes.

A modification of the converter of my invention may utilize an additional charge on the storage means derived through the back resistance of the junction electrode from the potential applied across the bilaterally conducting electrodes.

Figure 2:
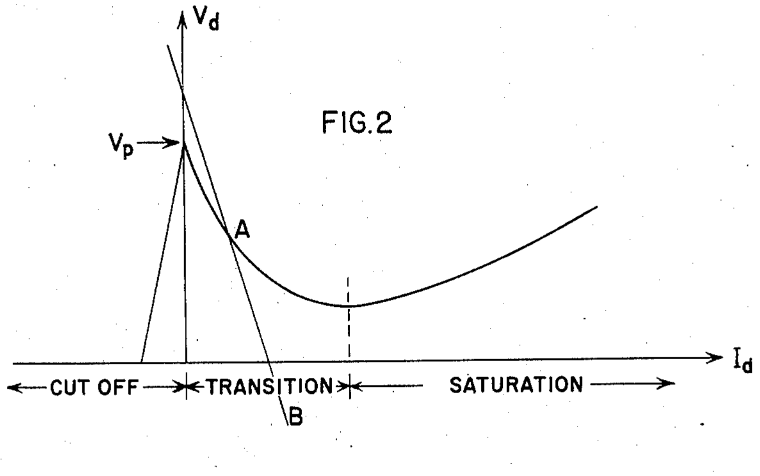
Figure 3:
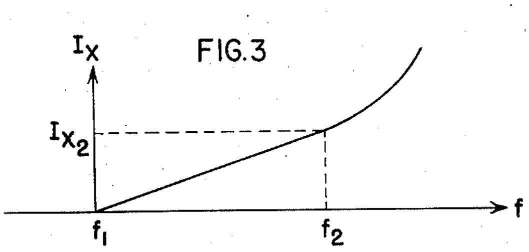
Figure 4:
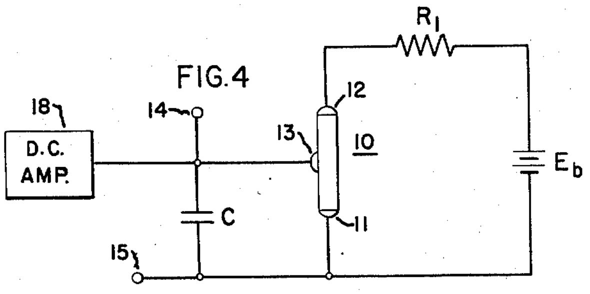

The novel features which I believe to be characteristic of my invention are set forth with particularity in the appended claims. My invention itself, however, together with further objects and advantages thereof can best be understood by reference to the following description taken in connection with the accompanying drawings in which Fig. 1 is a D. C. to A. C. frequency modulated converter illustrating one embodiment of my invention; Fig. 2 is a diagram which illustrates the input characteristics of a double-base diode and is useful in explaining my invention; Fig. 3 is an illustration of the variation in the output frequency of the oscillator of my invention with the input current; Fig. 4 illustrates an alternative embodiment of my invention.

Referring now to the drawings, in Fig. 1, I have shown an electric device or semiconductor member 10 which may be of rod or bar-like form. It may be assumed that the bar 10 is of N-type germanium with a resistivity of approximately 20 ohm-centimeters, which may be obtained from an admixture of germanium and a donor impurity such as phosphorous, arsenic, or antimony. Ohmic electrodes 11 and 12 are affixed to the respective ends of the bar 10. The electrodes 11 and 12 conduct current to and from the bar 10 without introducing appreciable rectifying properties, that is, they are predominantly bilateral in their conductive properties. Sprayed tin electrodes satisfactorily perform the services of affording an ohmic or bilateral contact. A rectifying junction 13 is established on the bar through the usual application of an acceptor type of impurity such as indium. For this purpose any of the well known techniques for diffusing the acceptor impurity into the bar may be used, in conjunction with such forming and mechanical structure as is needed to provide a reliable contact for junction 13.

The region between the junction electrode 13 and the bilaterally conducting electrode 11 is generally referred to as the "base-one" region and that between the junction electrode 13 and the bilaterally conducting electrode 12 as the "base-two" region. Such a device is called, and will hereafter be referred to, as a "double-base diode."

The input characteristics of a double-base diode are illustrated in Fig. 2, a plot of junction voltage versus input current, which shows three distinct regions, namely, a cut-off region, a transition region, and a saturating region. The cut-off region corresponds to the condition which exists when the junction is biased in its reverse direction and the slope of the input characteristic is effectively equal to the junction's back resistance. A typical range of values of this resistance for present germanium units is approximately 50,000 to 200,000 ohms.

If the junction is biased in its forward direction, minority carriers are injected into the bar in much the same way as minority carriers are emitted into the base region of a transistor. If the resistivity of the bar is sufficiently high and if the double-base diode is properly proportioned, the injected carriers will cause a significant reduction in the resistivity of the "base-one" region. The transition, or negative resistance region, is due to this resistance modulation of the base-one portion of the bar by the injected minority carriers. A typical value for the negative resistance in present germanium devices is 1,000 ohms. When the input current $I_d$ becomes sufficiently large, the base-one modulation effect decreases and the input resistance tends toward the positive value of a rectifying junction biased in its forward direction. As has been mentioned heretofore, this part of the characteristic has been termed the "saturating region." Typical values for the input resistance in the saturating region may range from 0–20 ohms.

The circuit of Fig. 1 has a potential source $E_b$, which may have a value of approximately six volts, connected across bilaterally conducting electrodes 11 and 12 of double-base diode 10 in series with a resistor R, of about 500 ohms and a capacitor C of about .005 microfarad connected from junction electrode 13 to one of the bilaterally conducting electrodes, here the base-one electrode 11. An output may be taken from across capacitor C at points 14 and 15. In addition, there is provided a current $I_x$, supplied from a voltage source $E_x$, which charges the capacitor C through a unidirectional impedance or rectifier that may be any standard small germanium unit. Voltage source $E_x$, which can be variable in the range from 0 to 30 volts, is connected in series with an impedance, here shown as a resistance 17 of approximately 100,000 ohms.

The operation of the circuit of Fig. 1 is as follows: A charge on capacitor C is built up from both the potential source $E_b$ through the back resistance of the junction 13, and from the voltage source $E_x$ through the resistance 17 and rectifier 16. The rate of charge is determined by the back characteristics of the junction 13, the magnitude of $E_b$, the magnitude of the capacitor C and the magnitude of $I_x$, which can be varied.

The load line AB of Fig. 2 is so set as to intersect the curve only at the point A. This defines an astable operating point of the circuit of Fig. 1 under these conditions. The circuit will oscillate at a frequency determined by the rate at which the capacitor, C, is charged from the battery supplies $E_x$ and $E_b$. If the charging current supplied by $E_x$ is considerably greater than the leakage current through the junction due to the source $E_b$, the frequency of oscillation will be determined predominantly by $E_x$. When the potential on the capacitor C reaches a sufficient level, $V_p$, which is the peak point associated with the negative-resistance characteristic of the double-base diode, the potential will break down the junction 13 by emitting carriers therein and capacitor C will discharge through the base-one region between the junction 13 and the base-one electrode 11. During this discharge the operating point of the double-base diode 10 traverses the transition and saturating regions shown in Fig. 2. Since there is no stable operating point in the saturating region, the double-base diode 10 can not stabilize in that region and the operating point reverts to the cut-off region. A repetition of this process will yield an alternating output across the points 14 and 15. The rate of charging C may be varied by varying $E_x$ and thus we have produced an oscillator, the frequency of which may be varied by varying the direct current input, or a D. C. to A. C. frequency modulated converter.

Referring now to Fig. 3, I have shown a graph illustrating the variation in frequency of the embodiment of Fig. 1 with the change in the direct current $I_x$ which is applied to the capacitor C. It can be seen from this graph, which was obtained from operational data, that the change in frequency is substantially linear with the change in input current $I_x$ up to the point $I_{x2}$ which, in the practical example set forth above, was about 100 microamperes. Thus in the range from $f_1$ to $f_2$, illustratively from 10–20 kilocycles, we have a linear frequency variation with direct input current.

In Fig. 4, I have shown another embodiment of my invention in which the oscillator of Fig. 1 is fed by a D. C. amplifier 18 which is used to charge the capacitor C. The D. C. amplifier serves to replace the network including the voltage source $E_x$, the resistance 17 and the rectifier 16 of Fig. 1. The mode of operation of this circuit is similar to that of Fig. 1. The D. C. amplifier output must present a high impedance to the input of the double-base diode and must, in addition, be able to charge the capacitor C to a potential in excess of the peak point, $V_p$, of the double-base diode.

Using the invention which I have described above, a direct current to alternating current frequency modulated converter may be produced which employs very simple circuitry and rugged components, and thus has distinct advantages over the converter circuitry of the prior art.

While I have shown particular embodiments of my invention, it will be understood, of course, that I do not wish to be limited thereto since many modifications may be made, and I, therefore, contemplate by the appended claims to cover any such modifications as fall within the true spirit and scope of my invention.

What I claim as new and desire to secure by Letters Patent of the United States is:

1. In combination, an electric device comprising a semiconductor body provided with spaced predominantly bilaterally conducting electrodes having a predominantly unilaterally conducting junction electrode disposed therebetween and adapted to inject carriers into the region affected by a first unidirectional potential difference between said bilaterally conducting electrodes; means for applying said first unidirectional potential difference between said bilaterally conducting electrodes; a capacitor connected across said junction and one of said bilaterally conducting electrodes adapted to charge through the back resistance of said junction from said first potential difference; means to apply a second variable potential difference across said capacitor, including a predominantly unidirectionally conducting means for preventing reverse current into the source of said second potential difference, the charge on said capacitor due to said second potential difference, combining with the charge due to said first potential difference in order to reach a level sufficient to cause said junction to emit said carriers into said semiconductor body, causing a negative resistance characteristic between said junction and said one of said bilaterally conducting electrodes, and discharging said capacitor therethrough; and means to regulate the level of said second unidirectional potential difference whereby the rate of charging of said capacitor may be varied yielding a resulting controllable variation in the frequency of discharge and providing a direct current to alternating current frequency modulating converter.

2. In combination, an electric device comprising a semiconductor body provided with spaced predominantly bilaterally conducting electrodes having a predominantly unilaterally conducting junction electrode disposed therebetween and adapted to inject carriers into the region affected by a potential difference between said bilaterally conducting electrodes, means for applying a first potential difference between said bilaterally conducting electrodes, storage means connected across said junction and one of said bilaterally conducting electrodes from across which a second potential difference may be taken as an output, and means including an impedance for applying a third potential difference across said storage means, said impedance including a substantially unidirectionally conducting impedance arranged to exclude current due to said second potential difference from the circuit including both said impedance and said means for applying said third potential difference whereby said second potential difference will appear on said storage means from both said first potential difference through the back resistance of said junction and said third potential difference through said impedance, until said second potential difference reaches a level sufficiently high to cause said junction to start emitting said carriers into said semiconductor body causing a negative resistance characteristic between said junction and said one of said bilaterally conducting electrodes and discharging said storage means therethrough.

3. A direct current to alternating current frequency modulated relaxation oscillator comprising a semiconductor device having a semiconducting body provided with spaced predominantly bilaterally conducting electrodes and a predominantly unilaterally conducting junction electrode disposed on said body in a region affected by an electric potential gradient between said bilaterally conducting electrodes, means for applying a first electric potential difference between said bilaterally conducting electrodes, capacitive means connected across said junction electrode and one of said bilaterally conducting electrodes, and means for applying a second potential difference across said capacitive means including an impedance in series with a variable current source, said impedance including a unidirectional impedance poled to pass current from said variable current source to said capacitive means in order to bias said junction electrode positively.

References Cited in the file of this patent

UNITED STATES PATENTS

| | | |
|---|---|---|
| 2,735,011 | Dickinson | Feb. 14, 1956 |

OTHER REFERENCES

"Principles of Transistor Circuits," by Shea et al.: Sept. 15, 1953; published by John Wiley and Sons, New York, N. Y., page 469 (Fig. 21.27).

Article: "Double Base Expands Diode Application," by Suran; pages 198–202 of Electronics for March 1955.